United States Patent [19]
Lau et al.

[11] Patent Number: 5,290,392
[45] Date of Patent: Mar. 1, 1994

[54] SINGLE CRYSTAL DIAMOND WAFER FABRICATION

[75] Inventors: James C. Lau, Torrance; Kenneth Lui, Fountain Valley; Richard P. Malmgren, Rancho Dominguez, all of Calif.

[73] Assignee: TRW Inc., Redondo Beach, Calif.

[21] Appl. No.: 894,685

[22] Filed: Jun. 5, 1992

[51] Int. Cl.$^5$ ............................................. C30B 29/04
[52] U.S. Cl. ........................... 156/610; 156/DIG. 68; 423/446; 437/84
[58] Field of Search ....... 156/610, 612, 613, DIG. 68; 257/77; 423/446; 427/255; 437/84

[56] References Cited

U.S. PATENT DOCUMENTS

| 4,547,257 | 10/1985 | Iizuka et al. | 156/DIG. 68 |
| 5,006,203 | 4/1991 | Purdes | 156/DIG. 68 |

FOREIGN PATENT DOCUMENTS 0345594  3/1991  Japan .

*Primary Examiner*—Olik Chaudhuri
*Assistant Examiner*—FeLisa Garrett
*Attorney, Agent, or Firm*—Ronald L. Taylor

[57] ABSTRACT

This invention discloses a method of fabricating a plurality of diamond semiconductor wafers from a single crystal diamond semiconductor boule, where the diamond boule is grown by a chemical vapor deposition (CVD) process. Initially, a single crystal diamond seed is polished and an impurity layer is deposited on the polished seed crystal. The CVD growth process is then initiated to deposit a layer of single crystal diamond over the impurity layer to form the diamond boule. At desirable intervals, the CVD growth process is stopped and a surface of the diamond boule is polished in order to accept another impurity layer. Each impurity layer is photolithographically patterned in order to generate an alternating configuration of impurity regions and hole regions. The impurity regions and the hole regions enable the bond between the diamond layers to be weakened without causing the crystalline orientation to deviate. Once the diamond semiconductor boule is developed by this process, it can be easily sliced by a laser slicing process into a plurality of diamond semiconductor wafers along the impurity layers.

20 Claims, 1 Drawing Sheet

SINGLE CRYSTAL DIAMOND WAFER FABRICATION

BACKGROUND OF THE INVENTION

1. Field of the Invention

This invention relates generally to a method of fabricating single crystal semiconductor wafers and, more particularly, to a method of fabricating single crystal diamond semiconductor wafers including cutting the semiconductor wafers from a large single crystal boule of diamond.

2. Discussion of the Related Art

The fabrication and use of diamond semiconductors is known in the art. Although diamond semiconductors are relatively costly to produce, they have a number of distinct advantages over other types of well known semiconductors, such as gallium arsenide semiconductors, which make them an attractive alternative for many applications. These advantages include at least high thermoconductivity providing for the effective removal of waste heat in a semiconductor device incorporating a diamond semiconductor. Consequently, higher thermoconductivity allows generation and dissipation of higher power. Additionally, diamond has a relatively large bandgap, thus providing a more reliable device with a higher signal-to-noise ratio.

Polycrystalline diamond semiconductors provide a device for at least partially realizing the advantages discussed above. However, a polycrystalline structure in and of itself provides a number of drawbacks. One of these drawbacks is the limitations of control of the current flow through a polycrystalline diamond semiconductor device due to the inconsistent orientation of the lattice structure.

In order to provide a worthwhile diamond semiconductor, it is believed to be necessary to utilize single crystal diamond in order to provide for a more reliable flow of electrons through the semiconductor. Because it is very difficult to provide carbon in a liquid form, the known methods of generating single crystal diamond are limited. With the development of chemical vapor deposition (CVD), however, the fabrication of single crystal diamond semiconductors at a reasonable production level is a real possibility. When large boules of high quality single crystal diamond are successfully developed by the CVD process, it is then generally necessary to slice the boules into semiconductor wafers for fabricating the single crystal diamond semiconductor devices.

Since diamond is the hardest known material, the abrasive cutting required to slice the wafers from the large single crystal boules is an extremely slow process. The use of lasers for cutting diamond wafers has generally been shown to be the most effective method at the present time. In a diamond cutting process, it is believed that an increase in the impurity level of the single crystal diamond reduces the diamond to diamond bonds in the lattice structure, and therefore, the effectiveness of the cutting may increase. However, as the impurity level of the diamond increase, the efficiency of the diamond material to act as a semiconductor device diminishes. Consequently, it appears a trade-off arises between high purity diamond and effectiveness of slicing the diamond boules.

What is needed then is a method of successfully slicing high purity single crystal diamond semiconductor boules into semiconductor wafers. It is therefore an object of the present invention to provide such a method.

SUMMARY OF THE INVENTION

This invention discloses a method of fabricating single crystal diamond semiconductors from a diamond boule in which the fabrication process enables effective slicing of the boule into single crystal diamond wafers. In general terms, this invention proposes deposition of layers of an impurity material at desirable intervals during a CVD growth process of the single crystal diamond which are desirably configured so as to not destroy the single crystal growth of the diamond, but which assist in the separation of the single crystal diamond boule into wafer slices.

Initially, in one preferred embodiment, the surface of a single crystal diamond seed is polished to be smooth and flat in order to advance single crystal growth. Additionally, the surface of the crystal seed is polished to be substantially flat in order to reduce the need for polishing subsequent diamond semiconductor layers. An impurity layer of an impurity which is not compatible with diamond growth is deposited on the smooth surface of the crystal seed so as to prevent CVD carbon atoms from at least occupying part of the space above the single crystal seed. The impurity layer further does not cause the diamond crystal growth to deviate from its original orientation of the crystal seed. The impurity layer can be patterned to form impurity regions and hole regions to attain the desired goal.

The CVD growth process is then initiated to grow single crystal diamond at the orientation of the crystal seed over the impurity layer. After the diamond crystal is grown over the impurity layer to a desirable thickness representing a wafer slice, the surface of the crystal is polished for acceptance of another impurity layer and another diamond crystal layer. This process of alternating diamond crystal layers and impurity layers is continued until the desired number of semiconductor wafers are fabricated. The diamond boule is then sliced by an appropriate cutting process generally utilizing a laser.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments concerning fabrication of single crystal diamond semiconductors is merely exemplary in nature and is in no way intended to limit the invention or its application or uses.

Figure 1:
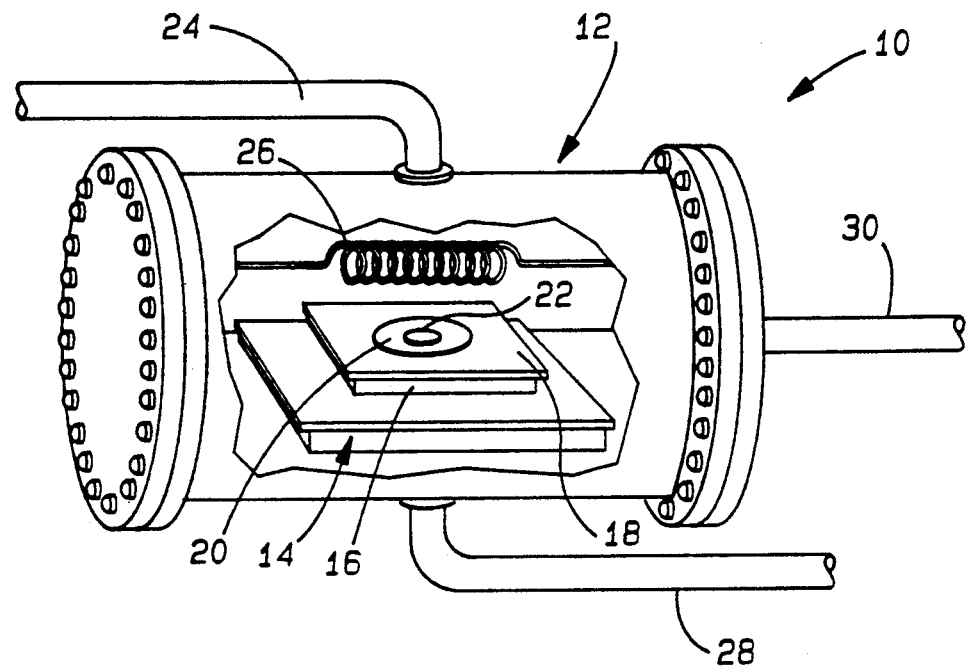
FIG. 1 is a cut-away perspective view of a chemical vapor deposition chamber including a diamond seed crystal to enable growth of a single crystal diamond boule by a process according to a preferred embodiment of the present invention.

As mentioned above chemical vapor deposition (CVD) provides a mechanism by which materials can be accurately fabricated in a crystalline format. Turning to FIG. 1, a chemical vapor deposition machine 10 is shown applicable to produce a number of different semiconductors by the chemical vapor deposition process. The chemical vapor deposition machine 10 includes a vacuum chamber 12 which is generally maintained at a pressure of between 10 and 100 TORRs by means of vacuum pumps (not shown) during the CVD growth process. Positioned within the chamber 12 is a platform 14 which is provided to support a thermocouple 16, a heated substrate holder 18 and a substrate 20. The thermocouple 16 is applicable to provide heat from a heating device (not shown) in order to heat the heated substrate holder 18 which, in turn heats the substrate 20 generally to a temperature of approximately 750°-900° C. Positioned on the substrate 20 is a single crystal diamond seed 22, such as a diamond gem, which will be heated along with the substrate 20 and grown into a single crystal diamond boule 36 (see FIG. 2) by the CVD process. In a preferred embodiment, the substrate 20 is a material on which the CVD diamond growth process will not occur. The initial size of the single crystal seed 22 may be small, however, when the fabrication process is mature for production, the seed 22 will generally be approximately 3-5 inches in diameter.

An intake pipe 24 is connected in communication with the chamber 12 in order to admit a feed gas which, when heated, provides the necessary atoms (here carbon) for growing the diamond boule 36. In order to produce diamond crystal, the feed gas will generally be a methane gas ($CH_4$) to provide the necessary carbon atoms. Once the methane gas is introduced into the chamber 12 through the intake pipe 24, a heating filament 26 heats the gas in order to separate the respective constituents in the gas, and thus, release the carbon atoms. Carbon atoms from the methane gas will adhere to the heated diamond crystal seed 22 generally in the same crystalline format as the crystal seed 22 in order to grow the single crystal diamond structure. The portion of the gas which is not deposited on the crystal seed 22 is exhausted through an exhaust pipe 28 connected in communication with the chamber 12. Additionally, a pipe 30 is connected in communication with the chamber 12 to enable gas within the chamber 12 to be transferred to a mass spectrometer (not shown) for analysis of the different constituents of the gas by a process which is well understood to those skilled in the art. The CVD growth process is well understood in the art and, as such, can be accomplished by a variety of different structural forms. The discussion above is merely cursory of one example.

Figure 2:
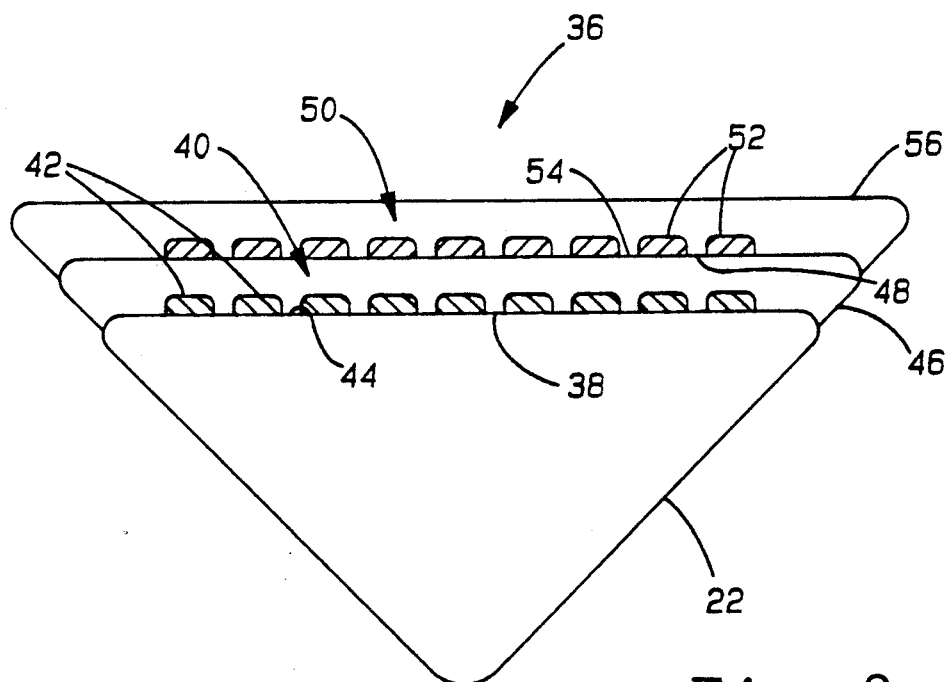
FIG. 2 is a side view of the single crystal diamond boule depicting an alternating configuration of impurity layers and diamond wafer layers.

Turning to FIG. 2, the single crystal diamond boule 36 fabricated by a CVD process such as the one above is shown in a side view. Initially, a top surface 38 of the crystal seed 22 is polished to be smooth and flat, by any known applicable polishing process, in order to accept an impurity layer 40. The impurity layer 40 is deposited on the surface 38 by any known applicable method such as vapor deposition. Methods for polishing seed crystals and depositing impurity layers are well known to those skilled in the art, and therefore, need not be discussed in detail here. In this regard, deposition of the impurity layer 40 can be accomplished within the chamber 12 or prior to the crystal seed 22 being admitted to chamber 12 by another applicable machine. The impurity layer 40 can be any impurity such as nickel, copper, iron, etc., which will impede the growth of the diamond crystalline structure. The configuration of the impurity layer 40 is such that the impurity will not preclude the deposition of a single crystalline structure with respect to the orientation of the lattice structure of the crystal seed 22, but will enable the bonds between the crystal seed 22 and the crystalline diamond structure grown by the CVD process to be weakened.

In a preferred embodiment, the impurity layer 40 is photolithographically patterned into a series of alternating areas of impurity regions 42 and hole regions 44. As is well understood in the art, photolithographic patterning generally includes depositing a layer of a photoresist material (not shown) on the surface 38, and then positioning a patterned mask (not shown) relative to the photoresist layer such that the photoresist layer is irradiated through the patterns in the mask. The irradiated areas of the photoresist layer are then developed by an appropriate solution and subsequently etched away to expose the impurity layer 40 relative to these areas. The exposed portions of the impurity layer 40 are then etched to form the hole regions 44. The remaining photoresist material on the impurity layer 40 is then dissolved away. Other methods of patterning the impurity layer 40 may also be applicable.

By generating an alternating series of regions of exposed crystal seed 22, it is possible to grow a first diamond semiconductor wafer layer 46 on the impurity layer 40 by the CVD process such that the diamond layer 46 maintains the same single crystalline structure as the crystal seed 22. The crystalline orientation is maintained due to the direct contact of the wafer layer 46 with the crystal seed 22 through the hole regions 44. Additionally, the bond between the wafer layer 46 and the crystal seed 22 is weakened due to the impurity regions 42. It is noted that favorable results can be achieved with different patterns of the hole regions 44 in the impurity layer 40. In a preferred embodiment, the thickness of the impurity layer 40 is within the range of 10-1000 angstroms, the width of the impurity regions 42 is within the range of 100-2000 angstroms, and the width of the non-impurity region 44 is within the range of 10-500 angstroms.

Once the impurity layer 40 has been Photolithographically etched to form the impurity regions 42 and the hole regions 44, the diamond boule 36 is prepared for the CVD process, as discussed above. In the CVD process, the semiconductor diamond layer 46 is deposited over the impurity layer 40 and the crystal seed 22, as shown in FIG. 2. The semiconductor diamond layer 46 is generally grown to a size which is larger than the crystal seed 22, as shown, as a product of the CVD process.

Once the first semiconductor diamond layer 46 is deposited, generally to a thickness of approximately between 1-10 mils depending on the desirable thickness of the wafer, a surface 48 of the wafer layer 46 is polished in order to prepare for a second impurity layer 50 and a second semiconductor layer 56. Once again the impurity layer 50 is photolithographically patterned into a series of impurity regions 5.2 and hole regions 54, as discussed above. Next, the second diamond semiconductor layer 56 is deposited over the impurity layer 50 by the CVD process. It is noted that each subsequent semiconductor layer is larger in size to the previous semiconductor layer. This process Of providing an alternating configuration of impurity layers and diamond semiconductor layers is continued until a desirable number of semiconductor layers are developed which can be cut into diamond wafers. In a preferred embodiment, the diamond boule 36 will include anywhere between 1 and 200 semiconductor layers.

Once the boule 36 is developed to the desirable number of layers, a laser (not shown) generating a narrow beam can be utilized to separate the different wafers along the impurity layers 40 and 50 in a quick and efficient manner in order to produce the separate semiconductor wafers. Because the impurity regions 42 and 52 reduce the diamond to diamond contact between the crystal seed 22 and the first semiconductor layer 46, and the first semiconductor layer 46 and the second semiconductor layer 56, the laser is effective in separating these layers. The use of laser methods to slice semiconductor boules into wafer slices is well known in the art, and as such, need not be elaborated on here.

Alternately, intentionally induced temperature differentials (thermal shock) between the impurity layers and the crystalline layers may break each semiconductor layer from the boule 36, and therefore effectively separate the wafers. A thermal shock procedure would generally require a heating source, such as a laser, which would heat the diamond boule 36 very rapidly such that thermal stresses develop between the impurity layers and the semiconductor layers, as a result of one layer expanding relative to the other. Such thermal stresses may be enough to separate the layers. This thermal shock procedure may provide an advantageous method of separating the semiconductor wafers in the boule 36.

The process above has been discussed with particular reference to fabricating diamond semiconductor wafers. However, the process can be expanded to incorporate other types of semiconductors, especially those in which this process would apt to be cost effective. Specifically, certain semiconductor materials, such as boron nitride and silicon carbide, are also very hard, and thus, their fabrication may benefit from the wafer fabrication process as discussed above. Consequently, the process is not limited to diamond semiconductors.

The foregoing discussion discloses and describes merely exemplary embodiments of the present invention. One skilled in the art will readily recognize from such discussion, and from the accompanying drawings and claims, that various changes, modifications can be made therein without departing from the spirit and scope of the invention as defined in the following claims.

What is claimed is:

1. A method of fabricating diamond semiconductor devices comprising the steps of:
   providing a single crystal diamond seed;
   depositing a first impurity layer on the diamond seed crystal; and
   depositing a first layer of single crystal diamond on the impurity layer, said impurity layer being configured on the seed crystal such that the impurity layer enables the single crystal diamond layer to maintain a single crystal orientation with respect to the seed crystal, but in which the impurity layer reduces the crystalline bond between the seed crystal and the single crystal diamond layer.

2. The method according to claim 1 further comprising the step of polishing a surface of the seed crystal on which the impurity layer is deposited prior to depositing the first impurity layer.

3. The method according to claim 1 further comprising the step of patterning the first impurity layer in order to provide an impurity layer which includes a configuration of impurity regions and hole regions.

4. The method according to claim 3 wherein the step of patterning includes photolithographically patterning the first impurity layer.

5. The method according to claim 3 wherein the step of patterning the first impurity layer includes providing impurity regions having a width within the range of approximately 100-2000 angstroms and hole regions having a width/diameter within the range of approximately 10-500 angstroms.

6. The method according to claim 1 further comprising the steps of depositing a second impurity layer on the first diamond layer and depositing a second single crystal diamond layer on the second impurity layer.

7. The method according to claim 1 wherein the steps of depositing a first impurity layer and a first crystal diamond layer includes depositing an alternating configuration of impurity layers and single crystal diamond layers.

8. The method according to claim 1 wherein the step of depositing the first diamond layer is performed by a chemical vapor deposition process.

9. The method according to claim 1 wherein the step of depositing the first impurity layer includes depositing the first impurity layer to a thickness within the range of approximately 10-1000 angstroms.

10. The method according to claim 1 wherein the step of depositing the first diamond layer includes depositing the first diamond layer to a thickness within the range of approximately 1 to 100 mils.

11. The method according to claim 1 further comprising the step of separating the first diamond layer from the seed crystal by a laser slicing process.

12. The method according to claim 1 further comprising the step of separating the first diamond layer from the seed crystal by a thermal shock process, said thermal shock process including rapidly heating the first impurity layer and the single crystal diamond layer in order to cause stresses between the first impurity layer and the first diamond layer.

13. The method according to claim 1 wherein the step of depositing a first impurity layer includes depositing a metal.

14. A method of fabricate semiconductor devices of a semiconductor material comprising the steps of:
   providing a seed of the single crystal semiconductor material;
   depositing a first impurity layer on the seed crystal;
   depositing a first semiconductor layer of the single crystal semiconductor material the impurity layer, wherein the impurity layer is configured on the seed crystal such that the impurity layer enables the first semiconductor layer to maintain the same single crystal orientation as the seed crystal, but in which the impurity layer reduces the crystalline bond between the seed crystal and the first semiconductor layer.

15. The method according to claim 14 wherein the step of providing a seed includes providing a single crystal diamond seed and the step of depositing a first semiconductor layer includes depositing a first layer of a single crystal diamond.

16. The method according to claim 14 wherein the step of depositing the first impurity layer includes patterning the impurity layer into regions of impurity regions and hole regions.

17. The method according to claim 14 further comprising the step of polishing a surface of the seed on which the impurity layer is deposited prior to depositing the first impurity layer.

18. The method according to claim 14 wherein the steps of depositing a first impurity layer and a first semiconductor layer include depositing an alternating configuration of impurity layers and semiconductor layers.

19. The method according to claim 14 further comprising the step of separating the first semiconductor layer from the seed along the impurity layer.

20. The method according to claim 14 wherein the step of depositing the single crystal diamond layer is performed by a chemical vapor deposition process.

* * * * *